US010292268B2

(12) United States Patent
Shui et al.

(10) Patent No.: US 10,292,268 B2
(45) Date of Patent: May 14, 2019

(54) FLEXIBLE PRINTED CIRCUIT BOARD, SUPPORTING HOLDER AND CONTROLLER

(71) Applicant: HTC Corporation, Taoyuan (TW)

(72) Inventors: Hung-Chi Shui, Taoyuan (TW); Ping-Kun Fu, Taoyuan (TW); Min-Jung Hsieh, Taoyuan (TW); Yu-yu Lin, Taoyuan (TW); Jen-Tsung Chang, Taoyuan (TW); Chih-Lin Chang, Taoyuan (TW)

(73) Assignee: HTC Corporation, Taoyuan (TW)

( * ) Notice: Subject to any disclaimer, the term of this patent is extended or adjusted under 35 U.S.C. 154(b) by 203 days.

(21) Appl. No.: 15/076,668

(22) Filed: Mar. 22, 2016

(65) Prior Publication Data

US 2017/0188462 A1 Jun. 29, 2017

Related U.S. Application Data

(60) Provisional application No. 62/387,201, filed on Dec. 24, 2015.

(51) Int. Cl.
*H05K 1/14* (2006.01)
*G01J 1/44* (2006.01)
(Continued)

(52) U.S. Cl.
CPC .............. *H05K 1/147* (2013.01); *G01J 1/44* (2013.01); *H05K 1/028* (2013.01); *H05K 1/18* (2013.01);
(Continued)

(58) Field of Classification Search
CPC ........ H05K 1/147; H05K 1/189; H05K 1/028; H05K 1/18; H05K 2201/053;
(Continued)

(56) References Cited

U.S. PATENT DOCUMENTS 5,436,745 A * 7/1995 Voisin ............... G02F 1/133382
349/150
5,508,781 A * 4/1996 Imai ........................ G02B 7/08
396/529

(Continued)

FOREIGN PATENT DOCUMENTS

CN 101340772 1/2009
CN 101466207 11/2011
(Continued)

OTHER PUBLICATIONS

"Search Report of Europe Counterpart Application", dated May 29, 2017, p. 1-p. 4, in which the listed references were cited.

(Continued)

*Primary Examiner* — Timothy J Thompson
*Assistant Examiner* — Paresh H Paghadal
(74) *Attorney, Agent, or Firm* — JCIPRNET

(57) ABSTRACT

A flexible printed circuit board including an annular main board and a plurality of branches connected with the annular main board is provided. Each of the branches includes an extension portion connected with the annular main board and a bonding portion, and an electronic component is adapted to be disposed on the bonding portion. A supporting holder including an annular base, two wing structures, and a plurality of mounting portions is also disclosed, wherein the wing structures extend outward from the annular base and the mounting portions are located on the annular base and the wing structures. Further, a controller including the flexible printed circuit board and the supporting holder aforementioned is disclosed, wherein the annular main board is disposed on the annular base and the branches are disposed on the annular base and the wing structures, such that the bonding portions are located on the mounting portions correspondingly.

11 Claims, 5 Drawing Sheets

(51) Int. Cl.
*H05K 1/02* (2006.01)
*H05K 1/18* (2006.01)
*H05K 7/06* (2006.01)
*H05K 7/02* (2006.01)
*H05K 3/32* (2006.01)

(52) U.S. Cl.
CPC .............. *H05K 1/189* (2013.01); *H05K 7/06* (2013.01); *H05K 1/0283* (2013.01); *H05K 1/148* (2013.01); *H05K 3/326* (2013.01); *H05K 7/023* (2013.01); *H05K 2201/05* (2013.01); *H05K 2201/052* (2013.01); *H05K 2201/053* (2013.01); *H05K 2201/055* (2013.01); *H05K 2201/056* (2013.01); *H05K 2201/058* (2013.01); *H05K 2201/09027* (2013.01); *H05K 2201/10151* (2013.01)

(58) Field of Classification Search
CPC ... H05K 2201/10151; H05K 2201/052; H05K 2201/09027; H05K 2201/056; G01J 1/44
See application file for complete search history.

(56) References Cited

U.S. PATENT DOCUMENTS

| | | | |
|---|---|---|---|
| 2009/0135576 A1* | 5/2009 | Chao | H05K 1/144 361/816 |
| 2012/0006907 A1 | 1/2012 | Niemann et al. | |
| 2013/0141913 A1* | 6/2013 | Sachsenweger | F21V 19/003 362/249.02 |
| 2014/0067056 A1* | 3/2014 | Schimpf | A61M 1/1086 623/3.13 |

FOREIGN PATENT DOCUMENTS

| | | |
|---|---|---|
| JP | H06273654 | 9/1994 |
| TW | 243584 | 3/1995 |
| TW | 201026167 | 7/2010 |
| TW | M499734 | 4/2015 |
| TW | 201536140 | 9/2015 |

OTHER PUBLICATIONS

"Office Action of Taiwan Counterpart Application," dated Jun. 26, 2017, p. 1-p. 6, in which the listed references were cited.
"Office Action of Europe Counterpart Application," dated Jun. 22, 2017, p. 1-p. 6.
"Office Action of Taiwan Counterpart Application," dated Aug. 29, 2017, p. 1-p. 6, in which the listed reference was cited.
"Office Action of Taiwan Counterpart Application," dated Sep. 29, 2017, p. 1-p. 6, in which the listed reference was cited.
"Office Action of Taiwan Counterpart Application," dated Feb. 27, 2018, p. 1-p. 6, in which the listed reference was cited.
"Office Action of China Counterpart Application," dated Aug. 27, 2018, pp. 1-6.

* cited by examiner

FLEXIBLE PRINTED CIRCUIT BOARD, SUPPORTING HOLDER AND CONTROLLER

CROSS-REFERENCE TO RELATED APPLICATION

This application claims the priority benefits of U.S. provisional application Ser. No. 62/387,201, filed on Dec. 24, 2015. The entirety of the above-mentioned patent application is hereby incorporated by reference herein and made a part of this specification.

BACKGROUND OF THE INVENTION

Field of the Invention

The application relates to a flexible printed circuit board, a supporting holder, and a controller, and particularly relates to a flexible printed circuit board, a supporting holder for supporting the flexible printed circuit board, and a controller using the flexible printed circuit board and the supporting holder.

Description of Related Art

In recent years, as the technology industries thrive, electronic devices, such as personal computer (PC), tablet PC, notebook computer (NB), and smart phone, have become very common in our daily life. Electronic devices are developed into diverse forms and have more and more functions, and the convenience and practicability brought by the electronic devices make them become more and more popular. Such electronic devices may be equipped with electronic components as required and the electronic components may be disposed on a circuit board or connected through a flexible printed circuit board for the electronic devices to perform corresponding functions.

Take a controller with sensing components as an example, the sensing components may be disposed on the flexible printed circuit board and then disposed on a supporting holder to be assembled into the controller. Accordingly, the controller is able to detect a signal sent by a signal source through the sensing components (to sense an infrared ray emitted by the signal source through an infrared sensor, for example) so as to generate a corresponding control signal. The sensing components may also be other types of electronic components to enable the controller to execute corresponding operations. Thus, according to the configuration of the electronic components and the structural design of the supporting holder, the controller may use a plurality of strip flexible printed circuit boards to carry the electronic components in multiple directions of the supporting holder. However, tolerances may easily occur in the assembly of the flexible printed circuit boards in the controller, and the assembly process is relatively complicated.

SUMMARY OF THE INVENTION

The application provides a flexible printed circuit board, a supporting holder for supporting the flexible printed circuit board, and a controller using the flexible printed circuit board and the supporting holder, which are easy to assemble and improve the operational efficiency of the controller.

The flexible printed circuit board of the application is adapted for a controller. The flexible printed circuit board includes an annular main board and a plurality of branches. The branches are connected with and surround the annular main board. Each of the branches includes an extension portion and a bonding portion. The extension portion connects the bonding portion with the annular main board, and an electronic component is adapted to be disposed on the bonding portion.

The supporting holder of the application is adapted for supporting a flexible printed circuit board in a controller. The supporting holder includes an annular base, two wing structures, and a plurality of mounting portions. The wing structures extend outward from the annular base. The mounting portions are located on the annular base and the wing structures.

The controller of the application includes at least one flexible printed circuit board and at least one supporting holder. The flexible printed circuit board includes an annular main board and a plurality of branches. The branches are connected with and surround the annular main board. Each of the branches includes an extension portion and a bonding portion. The extension portion connects the bonding portion with the annular main board, and an electronic component is adapted to be disposed on the bonding portion. The supporting holder supports the flexible printed circuit board. The supporting holder includes an annular base, two wing structures, and a plurality of mounting portions. The wing structures extend outward from the annular base. The mounting portions are located on the annular base and the wing structures. The annular main board is disposed on the annular base and the branches are disposed on the annular base and the wing structures, such that the bonding portions are located on the mounting portions correspondingly.

Based on the above, in the controller of the application, the flexible printed circuit board includes the annular main board and the branches while the supporting holder includes the annular base, two wing structures, and multiple mounting portions located on the annular base and the wing structures. Therefore, when the flexible printed circuit board and the supporting holder are assembled to form the controller, the annular main board is disposed on the annular base and the branches are disposed on the annular base and the wing structures, such that the bonding portions of the branches and the electronic components on the bonding portions are located on the mounting portions correspondingly. Accordingly, the flexible printed circuit board of the application obtains multiple bonding portions with an annular distribution without need of connecting manner and the assembly process is relatively simple. Moreover, the supporting holder of the application increases the configuration range of the mounting portions through the wing structures, so as to increase the number and configuration range of the bonding portions of the flexible printed circuit board and the electronic components on the bonding portions and thereby improve the operational efficiency of the controller of the application.

To make the aforementioned and other features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
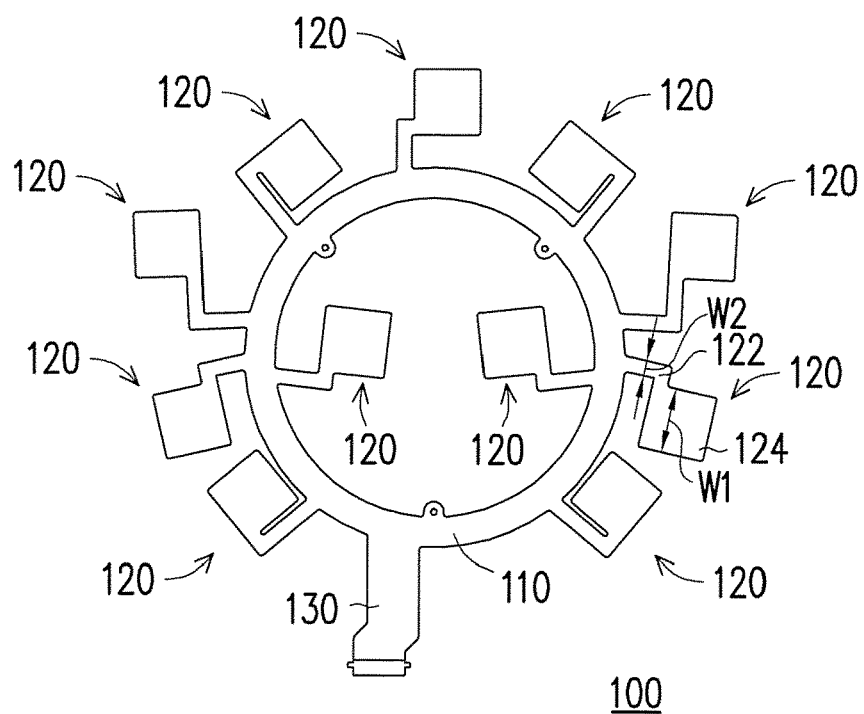
FIG. 1 is a schematic top view of a flexible printed circuit board according to an embodiment of the invention.
Figure 2:
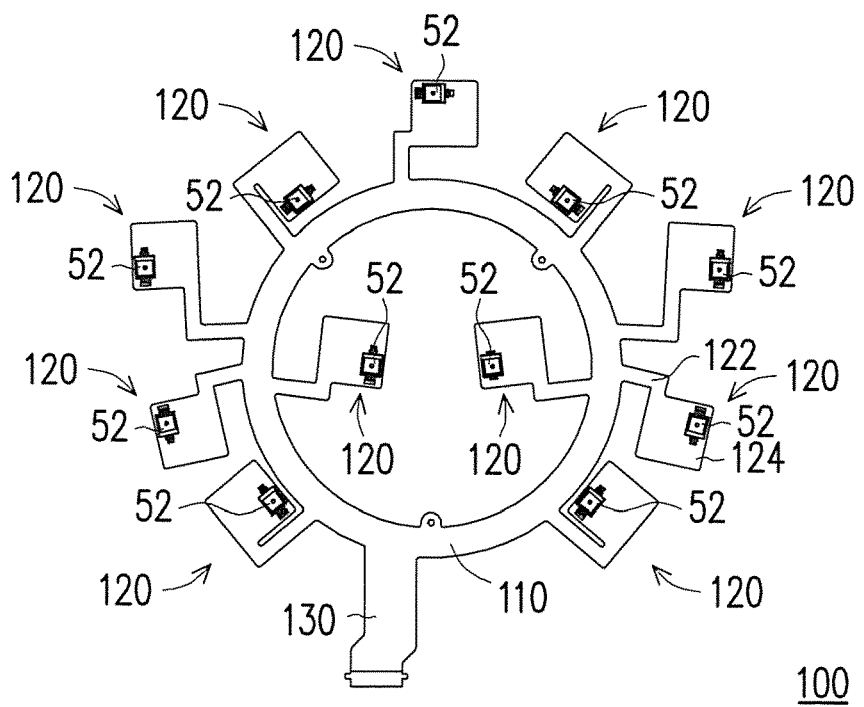
FIG. 2 is a schematic top view of the flexible printed circuit board of FIG. 1 with electronic components thereon.

FIG. 1 is a schematic top view of a flexible printed circuit board according to an embodiment of the invention. FIG. 2 is a schematic top view of the flexible printed circuit board of FIG. 1 with electronic components thereon. Referring to FIG. 1 and FIG. 2, in this embodiment, a flexible printed circuit board 100 includes an annular main board 110 and a plurality of branches 120. The branches 120 are connected with and surround the annular main board 110. Each of the branches 120 includes an extension portion 122 and a bonding portion 124. The extension portion 122 connects the bonding portion 124 with the annular main board 110. Accordingly, the flexible printed circuit board 100 is adapted for a controller 50 (as shown in the figures described below), wherein an electronic component 52 required by the controller 50 is disposed on the bonding portion 124 (as shown in FIG. 2) and the flexible printed circuit board 100 is further connected with the electronic parts in the controller 50. Nevertheless, the flexible printed circuit board 100 of the application is not necessarily applied to the controller and may also be used in other electronic devices.

Specifically, in this embodiment, the annular main board 110 of the flexible printed circuit board 100 has a substantially annular shape, but the application is not limited thereto. The branches 120 surround the annular main board 110 and are integrally connected with a lateral side of the annular main board 110, and it may be deemed that the branches 120 are formed by extending from the lateral side of the annular main board 110. Each of the branches 120 includes the extension portion 122 and the bonding portion 124, wherein the extension portion 122 extends from the lateral side of the annular main board 110 and the bonding portion 124 is connected with the corresponding extension portion 122 and is located at an end of the branch 120. The number of the branches 120 in this embodiment is eleven, for example, wherein two of the branches 120 extend toward a center of the annular main board 110 from an inner side of the annular main board 110 while the other nine of the branches 120 extend outward from an outer side of the annular main board 110. Therefore, the flexible printed circuit board 100 of this embodiment includes eleven bonding portions 124. Nevertheless, it should be noted that the application is not intended to limit the number and locations of the branches 120/the bonding portions 124, which may be adjusted as required.

Moreover, in this embodiment, the flexible printed circuit board 100 further includes a connection portion 130 and connection lines (not shown). The connection portion 130 is connected with the annular main board 110 and is located between two adjacent branches 120. The connection lines are disposed on the annular main board 110 and the branches 120 and extend from the connection portion 130 to the bonding portion 124 of each of the branches 120. Thereby, the electronic component 52 may be disposed on the bonding portion 124 of each of the branches 120 in a proper manner (fixed on a conductive pad on the bonding portion 124 via a conductive adhesive or solder, for example) to be electrically connected with the connection lines on the corresponding branch 120. Preferably, a width W1 of each of the bonding portions 124 is greater than a width W2 of the corresponding extension portion 122, so as to facilitate disposing the electronic component 52 on each bonding portion 124, and the extension portion 122 may be reduced in size as long as it is sufficient for disposing the corresponding connection lines, such that the assembly of the branch 120 is more flexible for further application. However, the application is not limited to the embodiment described above and may be adjusted as required. Moreover, in order to increase the structural strength of the bonding portion 124, a reinforcement plate may be disposed on a back surface (opposite to the surface where the electronic component is disposed) of the bonding portion 124.

Thus, in this embodiment, when the flexible printed circuit board 100 with the electronic component 52 thereon is further applied to the controller 50 (as shown in the figures described below), the flexible printed circuit board 100 is suitable to be connected with the electronic parts in the controller 50 via the connection portion 130, such that the electronic component 52 required by the controller 50 is electrically connected with the electronic parts in the controller 50 via the connection lines on the corresponding branch 120 and the connection portion 130. However, the application is not limited to the embodiment described above and may be adjusted as required. Based on the design described above, the flexible printed circuit board 100 of this embodiment obtains multiple bonding portions 124 with an annular distribution without need of connecting manner and therefore the assembly process is relatively simple.

Figure 3:
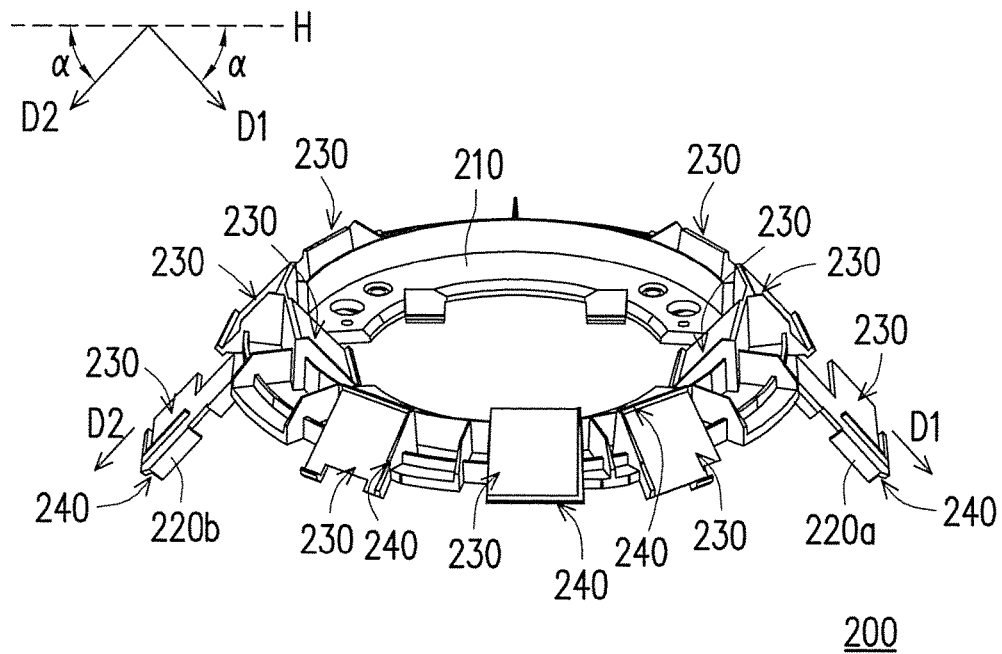
FIG. 3 is a schematic perspective view of a supporting holder according to an embodiment of the invention.
Figure 4:
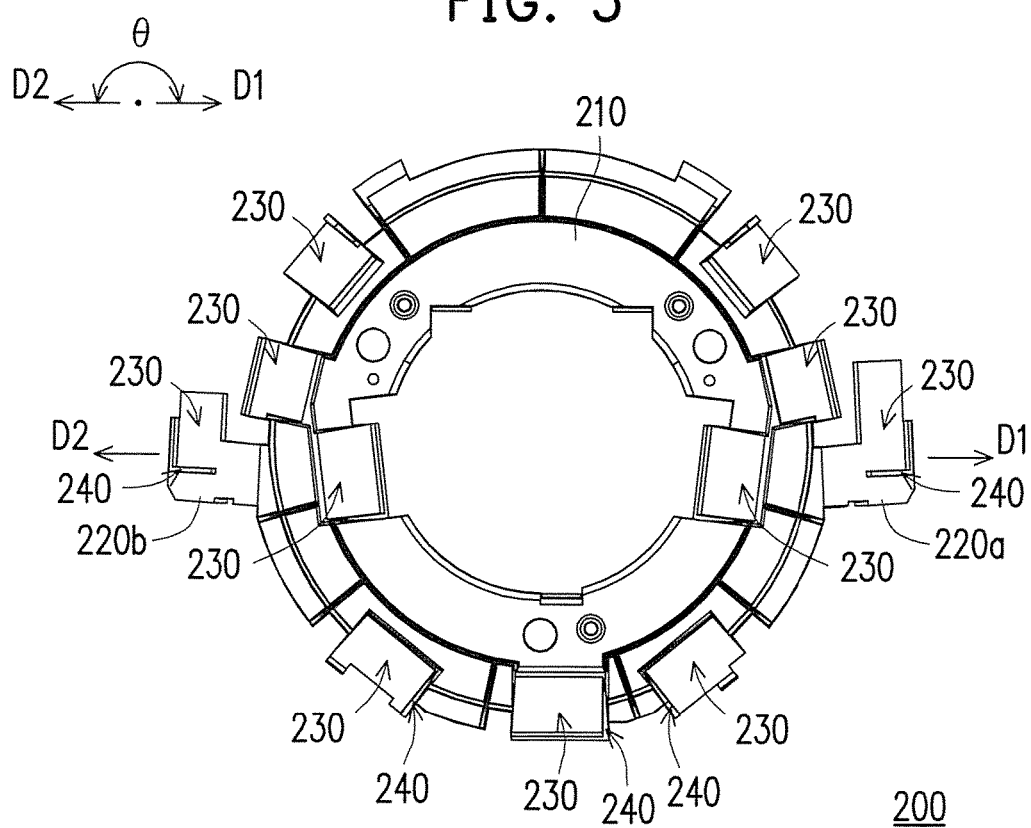
FIG. 4 is a schematic top view of the supporting holder of FIG. 3.

FIG. 3 is a schematic perspective view of a supporting holder according to an embodiment of the invention. FIG. 4 is a schematic top view of the supporting holder of FIG. 3. Referring to FIG. 3 and FIG. 4, in this embodiment, a supporting holder 200 includes an annular base 210, two wing structures 220a and 220b, and a plurality of mounting portions 230. The wing structures 220a and 220b extend outward from the annular base 210. The mounting portions 230 are disposed on the annular base 210 and the wing structures 220a and 220b. Accordingly, the supporting holder 200 is adapted for supporting the flexible printed circuit board 100 in the controller 50 (as shown in the figures described below). However, the application is not intended to limit the flexible printed circuit board supported by the supporting holder 200 and the application thereof. That is, the supporting holder 200 may also be used to support other flexible printed circuit boards or other electronic parts, and may also be used in other electronic parts.

Specifically, in this embodiment, the annular base 210 of the supporting holder 200 has a substantially annular shape, but the invention is not limited thereto. The wing structures 220a and 220b are connected integrally with a lateral side of the annular base 210 and extend outward from the annular base 210. The mounting portions 230 are disposed on the annular base 210 and the wing structures 220a and 220b. In this embodiment, the number of the mounting portions 230 is eleven, for example, wherein two of the mounting portions 230 are located on the annular base 210 close to an inner side of the annular base 210, seven are located on the annular base 210 close to an outer side of the annular base 210, and two are respectively located on the wing structures 220a and 220b. Nevertheless, the application is not intended to limit the number and locations of the mounting portions 230, which may be adjusted as required. Thus, the annular base 210 and the wing structures 220a and 220b all have the mounting portions 230 thereon.

Moreover, in this embodiment, the wing structures 220a and 220b have an angle θ (as shown in FIG. 4) therebetween, and each of the wing structures 220a and 220b respectively tilts and extends toward a side of the annular base 210 to form a tilt angle α (as shown in FIG. 3) with respect to a horizontal reference plane H where the annular base 210 is located. The angle θ refers to an angle between extending directions D1 and D2 of the wing structures 220a and 220b when the supporting holder 200 is viewed from above (as shown in FIG. 4), and the tilt angle α refers to an angle of the extending directions D1 and D2 of the wing structures 220a and 220b with respect to the horizontal reference plane H where the annular base 210 is located when the supporting holder 200 is in a horizontal state. In this embodiment, the angle θ is 180 degrees, for example, and the wing structures 220a and 220b tilt and extend toward the same side of the annular base 210 and preferably have the same tilt angle α, such that the wing structures 220a and 220b are symmetrically located on two opposite sides of the annular base 210. Nevertheless, the application is not limited thereto and the configuration may be adjusted as required.

In addition, in this embodiment, each mounting portion 230 further has a positioning structure 240. The positioning structure 240 protrudes from the mounting portion 230 and extends in two directions to restrict the corresponding bonding portion 124. Specifically, the positioning structure 240 is an L-shaped rib that extends in two directions and protrudes from two adjacent lateral sides of the mounting portion 230, for example. Therefore, when the flexible printed circuit board 100 is disposed on the supporting holder 200, the bonding portion 124 is restricted by the positioning structure 240 in two directions to be disposed at a fixed position on the mounting portion 230. That is, two adjacent lateral sides of the bonding portion 124 may be restricted by the L-shaped positioning structure 240 to be disposed on the mounting portion 230 easily. It is known from the above that the design of the positioning structure 240 helps to position the bonding portion 124 on the mounting portion 230. Nevertheless, the application is not intended to limit the type of the positioning structure 240 or whether the positioning structure 240 is disposed, which may be adjusted as required.

Thus, in this embodiment, when the supporting holder 200 is further applied to the controller 50 (as shown in the figures described below), the supporting holder 200 is suitable for supporting the aforementioned flexible printed circuit board 100 (as shown in FIG. 1 and FIG. 2) to be assembled to other electronic parts (not shown), so as to fix the flexible printed circuit board 100 in the controller 50. More specifically, when the flexible printed circuit board 100 is disposed on the supporting holder 200, the annular main board 110 and the branches 120 of the flexible printed circuit board 100 are located on the annular base 210 and the wing structures 220a and 220b, and the bonding portion 124 of each of the branches 120 is located on the corresponding mounting portion 230. Based on the design described above, the supporting holder 200 of this embodiment increases the configuration range of the mounting portions 230 through the wing structures 220a and 220b, which also increases the number and configuration range of the bonding portions 124 of the flexible printed circuit board 100 and the electronic components 52 on the bonding portions 124 (as shown in FIG. 1 and FIG. 2) and thereby improves the operational efficiency of the controller 50 (as shown in the figures described below) using the supporting holder 200.

Figure 5:
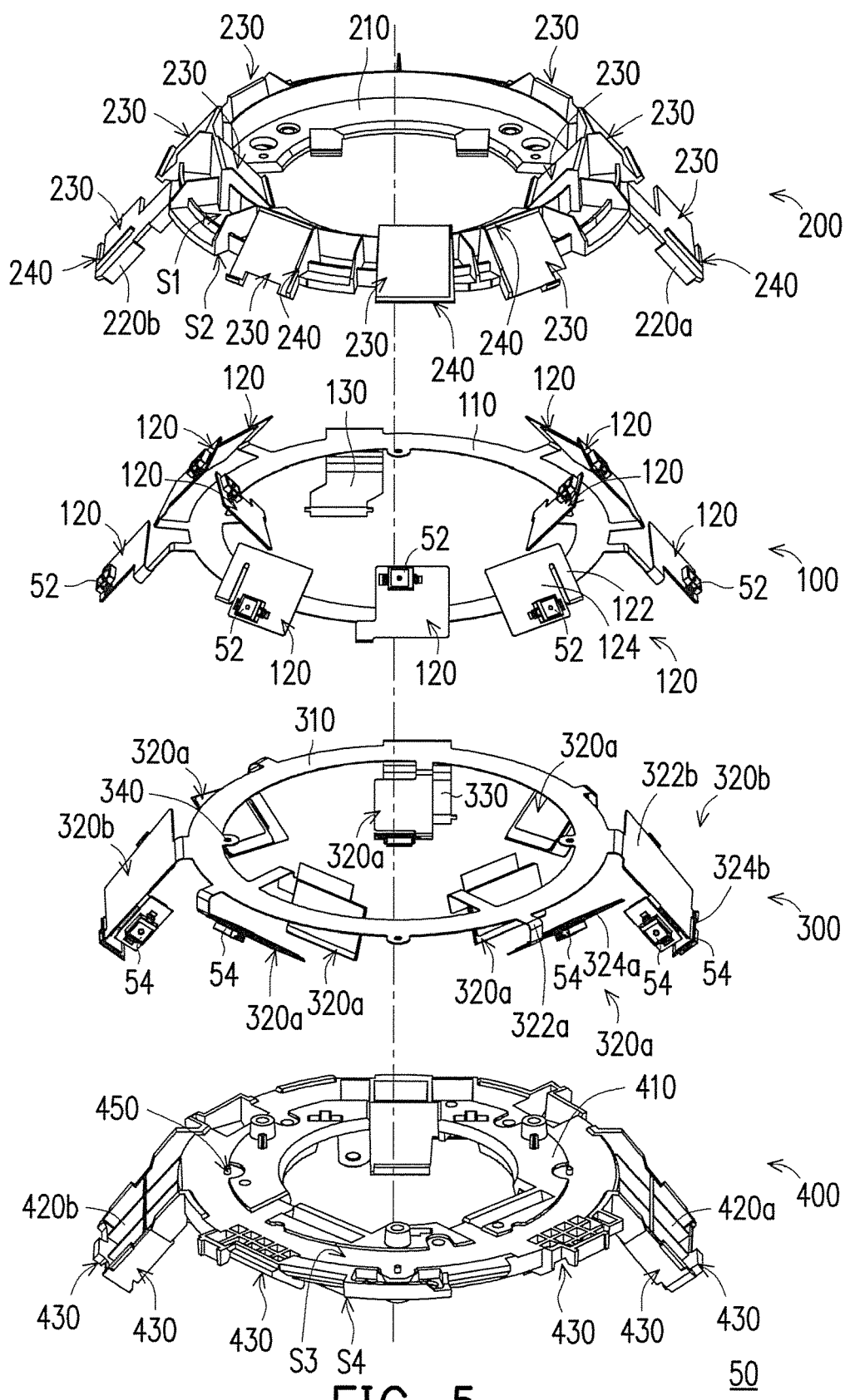
FIG. 5 is a schematic exploded view of a controller according to an embodiment of the invention.
Figure 6:
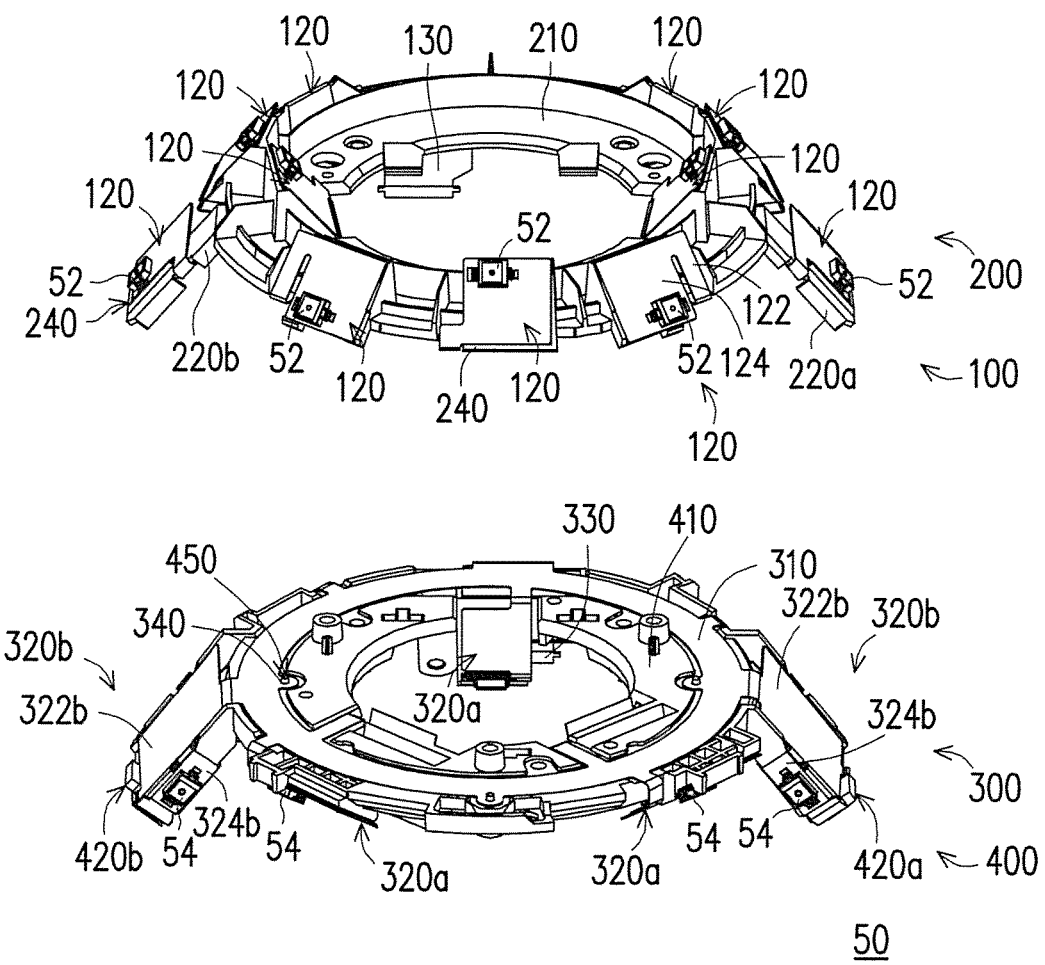
FIG. 6 is a schematic view of assembly of the controller of FIG. 5.
Figure 7:
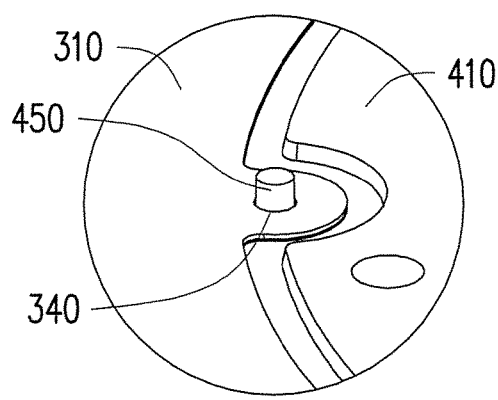
FIG. 7 is a partially enlarged view of the controller of FIG. 6.
Figure 8:
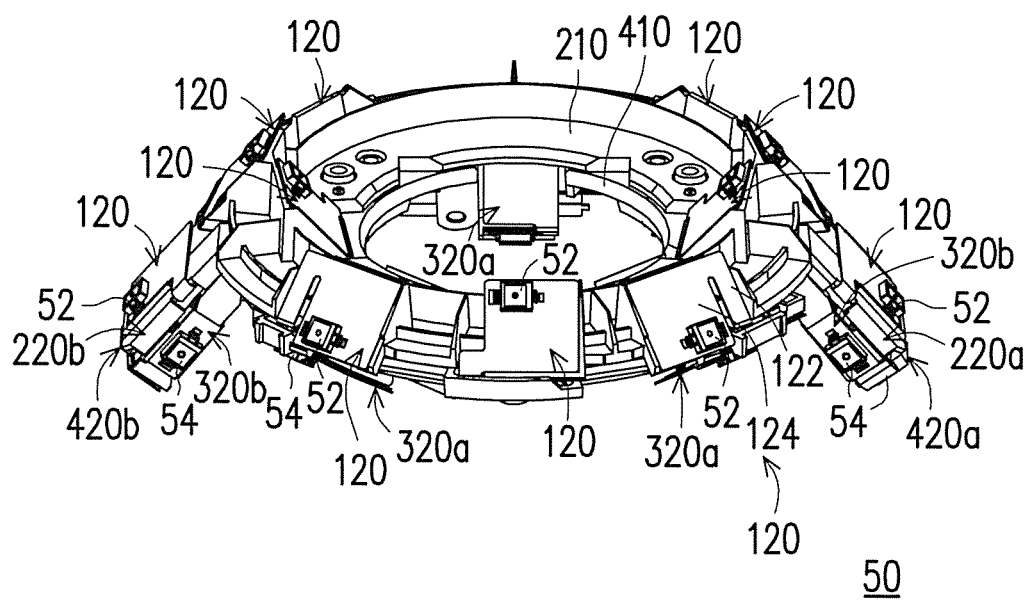
FIG. 8 is a schematic perspective view of the controller of FIG. 5.

FIG. 5 is a schematic exploded view of a controller according to an embodiment of the invention. FIG. 6 is a schematic view of assembly of the controller of FIG. 5. FIG. 7 is a partially enlarged view of the controller of FIG. 6. FIG. 8 is a schematic perspective view of the controller of FIG. 5. Referring to FIG. 5 to FIG. 8, in this embodiment, the controller 50 includes two flexible printed circuit boards 100 and 300 and two supporting holders 200 and 400. The flexible printed circuit boards 100 and 300 are disposed on the supporting holders 200 and 400 correspondingly, and the supporting holders 200 and 400 are assembled to each other. However, in other embodiments not shown here, the number of the flexible printed circuit boards and the supporting holders may be one or more, and the flexible printed circuit boards and the supporting holders correspond to each other. Nevertheless, the application does not exclude the possibility of using one single supporting holder to support multiple flexible printed circuit boards, which may be adjusted as required.

Specifically, regarding this embodiment, the structural features of the flexible printed circuit board 100 and the supporting holder 200 have been specified above and thus are not repeated hereinafter. The flexible printed circuit board 100 is disposed on the supporting holder 200, wherein the annular main board 110 is disposed on the annular base 210 and the branches 120 are disposed on the annular base 210 and the wing structures 220a and 220b, such that the bonding portions 124 are located on the mounting portions 230 correspondingly. Furthermore, the annular base 210 has a top surface S1 and a bottom surface S2 opposite to each other, and the mounting portions 230 are located on the top surface S1 of the annular base 210 and the wing structures 220a and 220b. The annular main board 110 of the flexible printed circuit board 100 is disposed on the bottom surface S2 of the annular base 210, and the branches 120 extend to the top surface S1 of the annular base 210 and the wing structures 220a and 220b through the corresponding extension portions 122, such that the bonding portion 124 of each of the branches 120 is located on the mounting portion 230 correspondingly, as shown in the upper parts of FIG. 5 and FIG. 6. Accordingly, the bonding portions 124 with the electronic components 52 thereon are disposed on the mounting portions 230 and have an annular distribution on the annular base 210 and the wing structures 220a and 220b of the supporting holder 200. However, in other embodiments not shown here, the flexible printed circuit board 100 may also be disposed on the top surface S1 of the annular base 210. Nevertheless, the application is not limited to the embodiment described above.

Furthermore, in this embodiment, the flexible printed circuit board 300 and the supporting holder 400 have similar structural features. Specifically, the flexible printed circuit board 300 includes an annular main board 310, a plurality of branches 320a and 320b, a connection portion 330, and connection lines (not shown). The supporting holder 400 includes an annular base 410, two wing structures 420a and 420b, and a plurality of mounting portions 430. The structural features of the annular main board 310, the branches 320a and 320b, the connection portion 330, and the connection lines have been specified in the descriptions of the annular main board 110, the branches 120, the connection portion 130, and the connection lines. Moreover, the structural features of the annular base 410, the wing structures 420a and 420b, and the mounting portions 430 have been specified in the descriptions of the annular base 210, the wing structures 220a and 220b, and the mounting portions 230. Thus, descriptions of similar parts are not repeated hereinafter.

In this embodiment, a main difference between the flexible printed circuit board 300 and the aforementioned flexible printed circuit board 100 is that the number of the branches 320a and 320b of the flexible printed circuit board 300 is different from the number of the branches 120 of the aforementioned flexible printed circuit board 100, and the branch 320b has different structural features from the branches 120 and 320a. Specifically, in this embodiment, the number of the branches 320a and 320b of the flexible printed circuit board 300 is nine, for example. Three branches 320a extend toward a center of the annular main board 310 from an inner side of the annular main board 310 and include an extension portion 322a and a bonding portion 324a. Likewise, the other four branches 320a extend outward from an outer side of the annular main board 310 and include the extension portion 322a and the bonding portion 324a. In addition, the extension portion 322a and the bonding portion 324a also have the structural design of the aforementioned extension portion 122 and the bonding portion 124 (for example, the width W1 of each of the bonding portions 124 is greater than the width W2 of the corresponding extension portion 122). In contrast, two branches 320b extend outward from the outer side of the annular main board 310 and include an extension portion 322b and three bonding portions 324b, wherein the bonding portions 324b are disposed on three adjacent lateral sides of the extension portion 322b, and a width of the extension portion 322b is greater than a width of each of the corresponding bonding portions 324b. The above design is made such that the bonding portions 124, 324a, and 324b of the flexible printed circuit boards 100 and 300 are staggered and not in contact with one another after being assembled. Nevertheless, the application is not intended to limit the number and locations of the branches 320a and 320b, which may be adjusted as required.

Accordingly, in this embodiment, the flexible printed circuit board 300 includes thirteen bonding portions 324a and 324b, and the electronic components 54 may be disposed on the bonding portions 324a and 324b of the branches 320a and 320b in a proper manner to be electrically connected with the connection lines on the corresponding branches 320a and 320b. When the flexible printed circuit board 300 with the electronic components 54 thereon is further used in the controller 50, the flexible printed circuit board 300 is suitable to be connected with the electronic parts in the controller 50 via the connection portion 330, such that the electronic components 54 required by the controller 50 are electrically connected with the electronic parts in the controller 50 via the connection lines on the corresponding branches 320a and 320b and the connection portion 330. Based on the design described above, the flexible printed circuit board 300 of this embodiment obtains the multiple bonding portions 324a and 324b with an annular distribution without need of connecting manner and therefore the assembly process is relatively simple.

On the other hand, a main difference between the supporting holder 400 and the aforementioned supporting holder 200 is that, in accordance with the structural design of the branch 320b of the flexible printed circuit board 300, the wing structures 420a and 420b include a plurality of mounting portions 430 correspondingly. Specifically, the number of the mounting portions 430 in this embodiment is thirteen, for example, wherein three mounting portions 430 are located on the annular base 410 close to the inner side of the annular base 410, four mounting portions 430 are located on the annular base 410 close to the outer side of the annular base 410, and six mounting portions 430 are respectively located on three adjacent lateral surfaces of the two wing structures 420a and 420b (that is, each of the wing structures 420a and 420b corresponds to three mounting portions 430). However, the application is not intended to limit the number and locations of the mounting portions 430, which may be adjusted as required. Thus, the annular base 410 and the wing structures 420a and 420b all have the mounting portions 430 thereon.

Furthermore, in this embodiment, the wing structures 420a and 420b may also have technical features similar to the angle θ and the tilt angle α (as shown in FIG. 3 and FIG. 4) of the aforementioned wing structures 220a and 220b. Preferably, an angle between the wing structures 420a and 420b is the same as the angle θ between the wing structures 220a and 220b, and a tilt angle of each of the wing structures 420a and 420b is the same as the tilt angle α of each of the wing structures 220a and 220b, such that the wing structures 420a and 420b and the wing structures 220a and 220b are suitable to be stacked and assembled. In addition, each of the mounting portions 430 may have a positioning structure (e.g. the L-shaped positioning structure 240 aforementioned). Nevertheless, the application is not intended to limit the type of the positioning structure or whether the positioning structure is disposed. Accordingly, the supporting holder 400 is suitable for supporting the flexible printed circuit board 300 and being assembled to other electronic parts not shown here, so as to fix the flexible printed circuit board 300 in the controller 50, wherein the annular main board 310 and the branches 320a and 320b of the flexible printed circuit board 300 are located on the annular base 410 and the wing structures 420a and 420b, and the bonding portions 324a and 324b of the branches 320a and 320b are located on the mounting portions 430 correspondingly.

Furthermore, in this embodiment, the annular base 410 has a top surface S3 and a bottom surface S4 opposite to each other, and the mounting portions 430 are located on the bottom surface S4 of the annular base 410 and the wing structures 420a and 420b. The annular main board 310 of the flexible printed circuit board 300 is disposed on the top surface S3 of the annular base 410, and the branches 320a and 320b extend to the bottom surface S4 of the annular base 410 and the wing structures 420a and 420b through the corresponding extension portions 322a and 322b, such that the bonding portions 324a and 324b of the branches 320a and 320b are located on the mounting portions 430 correspondingly, as shown in the lower parts of FIG. 5 and FIG. 6. Accordingly, the bonding portions 324a and 324b with the electronic components 54 thereon are disposed on the mounting portions 430 and have an annular distribution on the annular base 410 and the wing structures 420a and 420b of the supporting holder 400. However, in other embodiments not shown here, the flexible printed circuit board 300 may also be disposed on the bottom surface S4 of the annular base 410. Nevertheless, the application is not limited to the embodiment described above. Based on the design described above, the supporting holder 400 of this embodiment increases the configuration range of the mounting portions 430 through the wing structures 420a and 420b, which also increases the number and configuration range of the bonding portions 324a and 324b of the flexible printed circuit board 300 and the electronic components 54 on the bonding portions 324a and 324b and thereby improves the operational efficiency of the controller 50 (as shown in the figures described below) using the supporting holder 400.

Referring to FIG. 5 to FIG. 8, in this embodiment, a method of assembling the controller 50 includes respectively disposing the flexible printed circuit boards 100 and 300 on the corresponding supporting holders 200 and 400, for example, by fixing the flexible printed circuit boards 100 and 300 onto the corresponding supporting holders 200 and 400 by an adhesive (not shown), so as to form the upper and lower parts (as shown in FIG. 6). The annular main boards 110 and 310 of the flexible printed circuit boards 100 and 300 are located on the bottom surface S2 of the annular base 210 and the top surface S3 of the annular base 410 correspondingly to be sandwiched between the supporting holders 200 and 400, and the branches 120, 320a, and 320b are located on the top surface S1 of the annular base 210 and the bottom surface S4 of the annular base 410 to be fixed on the outer sides of the supporting holders 200 and 400. Thus, the flexible printed circuit boards 100 and 300 are fixed between the supporting holders 200 and 400 and the electronic components 52 and 54 disposed on the branches 120, 320a, and 320b are located on the outer sides of the supporting holders 200 and 400 and do not overlap one another.

Moreover, referring to FIG. 7, in this embodiment, the flexible printed circuit board 300 further includes a plurality of positioning structures 340 located on a periphery of the annular main board 310, which are positioning holes on the inner side or the outer side of the annular main board 310 for example, and the supporting holder 400 further includes a plurality of positioning structures 450 located on a periphery of the annular base 410, which are positioning pillars on the inner side or the outer side of the annular base 410 for example. The positioning structures 340 of the flexible printed circuit board 300 correspond to the positioning structures 450 of the supporting holder 400, so as to position the flexible printed circuit board 300 on the supporting holder 400. Likewise, the flexible printed circuit board 100 and the supporting holder 200 may also have similar positioning structures. Nevertheless, the application is not intended to limit the type of the positioning structure or whether the positioning structure is disposed, which may be adjusted as required. Then, the supporting holders 200 and 400 that respectively support the flexible printed circuit boards 100 and 300 are assembled together by engagement, locking, or other suitable means. At the moment, the electronic components 52 and 54 respectively on the bonding portions 124, 324a, and 324b have an annular distribution and are not in contact with one another.

Furthermore, in this embodiment, since the design of the wing structures 220a, 220b, 420a, and 420b may increase the number and configuration range of the bonding portions 124, 324a, and 324b and the electronic components 52 and 54, the angle θ between the wing structures 220a and 220b, the angle between the wing structures 420a and 420b, the tilt angle α of each of the wing structures 220a and 220b, and the tilt angle of each of the wing structures 420a and 420b may affect the operational efficiency of the controller 50 as well. The angle θ between the wing structures 220a and 220b (as shown in FIG. 4) and the angle between the wing structures 420a and 420b are preferably 180 degrees, but may be any angle (e.g. 45, 90, or 120 degrees) in a range of 0-180 degrees. Likewise, the tilt angle α of each of the wing structures 220a and 220b (as shown in FIG. 3) and the tilt angle α of each of the wing structures 420a and 420b may be any angle in a range of 0-90 degrees, and preferably in a range of 30-70 degrees. In this embodiment, the tilt angle α is 51 degrees. Nevertheless, the application is not limited thereto and the configuration may be adjusted as required.

In this embodiment, the electronic components 52 and 54 are infrared sensors, for example. The infrared sensors serving as the electronic components 52 and 54 are disposed on the bonding portions 124, 324a, and 324b correspondingly and are located on the mounting portions 230 and 430 and have an annular distribution, such that the electronic components 52 and 54 are able to sense signal sources (for example, to receive infrared rays emitted by the signal sources) in a range of 360 degrees, so as to determine relative positions of the controller 50 and the signal sources in the space.

In this embodiment, the flexible printed circuit boards 100 and 300 obtain multiple bonding portions 124, 324a, and 324b with an annular distribution without need of connecting manner and therefore the assembly process is relatively simple. Moreover, the supporting holders 200 and 400 increase the configuration range of the mounting portions 230 and 430 through the wing structures 220a, 220b, 420a, and 420b, so as to increase the number and configuration range of the bonding portions 124, 324a, and 324b of the flexible printed circuit boards 100 and 300 and the electronic components 52 and 54 on the bonding portions 124, 324a, and 324b. Accordingly, in addition to sensing signals in the range of 360 degrees by the electronic components 52 and 54 that have an annular distribution on the annular bases 210 and 410, the controller 50 also enhance the sensing efficiency by the electronic component 54 on the wing structures 220a, 220b, 420a, and 420b. Consequently, the operational efficiency of the controller 50 is improved. In other embodiments, the electronic components 52 and 54 may be other types of sensors or electronic components, and the electronic components 52 and 54 may be the same or different to enable the controller to perform corresponding operations/functions. Nevertheless, the application is not limited thereto.

To conclude the above, in the controller of the application, the flexible printed circuit board includes the annular main board and the branches while the supporting holder includes the annular base, two wing structures, and multiple mounting portions located on the annular base and the wing structures. Therefore, when the flexible printed circuit board and the supporting holder are assembled to form the controller, the annular main board is disposed on the annular base and the branches are disposed on the annular base and the wing structures, such that the bonding portions of the branches and the electronic components on the bonding portions are located on the mounting portions correspondingly. Accordingly, the electronic components have an annular distribution on the flexible printed circuit board and the supporting holder and are further distributed onto the wing structures. Moreover, according to the number and configuration/locations of the electronic components required by the controller, the number of the flexible printed circuit boards and the number of the supporting holders may be more than one as required, and preferably the electronic components on multiple flexible printed circuit boards do not overlap one another after assembly. Accordingly, the flexible printed circuit board of the application obtains multiple bonding portions with an annular distribution without need of connecting manner and the assembly process is relatively simple. Moreover, the supporting holder of the application increases the configuration range of the mounting portions through the wing structures, so as to increase the number and configuration range of the bonding portions of the flexible printed circuit board and the electronic components on the bonding portions and thereby improve the operational efficiency of the controller of the application.

It will be apparent to those skilled in the art that various modifications and variations can be made to the disclosed embodiments without departing from the scope or spirit of the disclosure. In view of the foregoing, it is intended that the disclosure covers modifications and variations of this disclosure provided that they fall within the scope of the following claims and their equivalents.

What is claimed is:

1. A controller, comprising:
   at least one flexible printed circuit board, comprising:
      an annular main board; and
      a plurality of branches connected with and surrounding the annular main board and each of the branches comprising an extension portion and a bonding portion, wherein the extension portion connects the bonding portion with the annular main board, and an infrared sensor is configured to be disposed on the bonding portion, at least a portion of the plurality of branches extend toward a center of the annular main board from an inner side of the annular main board, and at least another portion of the plurality of branches extend outward from an outer side of the annular main board; and
   at least one supporting holder supporting the at least one flexible printed circuit board and comprising:
      an annular base;
      two wing structures extending outward from the annular base; and
      a plurality of mounting portions located on the annular base and the wing structures, wherein the annular main board is disposed on the annular base and the branches are disposed on the annular base and the wing structures, such that the bonding portions are located on the mounting portions correspondingly.

2. The controller according to claim 1, wherein a width of each of the bonding portions is greater than a width of the corresponding extension portion.

3. The controller according to claim 1, wherein the flexible printed circuit board further comprises a connection portion connected with the annular main board and located between adjacent two of the branches.

4. The controller according to claim 1, wherein the wing structures have an angle therebetween and the angle is 180 degrees.

5. The controller according to claim 1, wherein each of the wing structures tilts and extends toward a side of the annular base and forms a tilt angle with respect to a horizontal reference plane where the annular base is located.

6. The controller according to claim 5, wherein the wing structures tilt and extend toward the same side of the annular base.

7. The controller according to claim 1, wherein the flexible printed circuit board further comprises a plurality of positioning structures located on a periphery of the annular main board and the supporting holder further comprises a plurality of positioning structures located on a periphery of the annular base, and the positioning structures of the flexible printed circuit board correspond to the positioning structures of the supporting holder, so as to position the flexible printed circuit board on the supporting holder.

8. The controller according to claim 1, wherein each of the mounting portions comprises a positioning structure that protrudes from the mounting portion and extends in two directions.

9. The controller according to claim 1, wherein the number of the at least one flexible printed circuit board and the number of the at least one supporting holder are more than one, each of the at least one flexible printed circuit boards disposed on each of the at least one supporting holders correspondingly, and the at least one flexible printed circuit board and the at least one supporting holders are assembled to each other.

10. The controller according to claim 9, wherein the bonding portions of the at least one flexible printed circuit boards are not in contact with the bonding portions of another of the at least one flexible printed circuit boards after being assembled.

11. A controller, comprising:
    at least one flexible printed circuit board, comprising:
       an annular main board; and
       a plurality of branches connected with and surrounding the annular main board and each of the branches comprising an extension portion and a bonding portion, wherein the extension portion connects the bonding portion with the annular main board, and an infrared sensor is configured to be disposed on the bonding portion, at least a portion of the plurality of branches extend toward a center of the annular main board from an inner side of the annular main board, and at least another portion of the plurality of branches extend outward from an outer side of the annular main board; and
    at least one supporting holder supporting the at least one flexible printed circuit board and comprising:
       an annular base;
       two wing structures, wherein each of the wing structures tilts and extends outward from the annular base and forms a tilt angle with respect to a horizontal reference plane where the annular base is located; and
       a plurality of mounting portions located on the annular base and the wing structures, wherein the annular main board is disposed on the annular base and the branches are disposed on the annular base and the wing structures, such that the bonding portions are located on the mounting portions correspondingly.

* * * * *